(12) United States Patent
Thiel et al.

(10) Patent No.: US 8,297,433 B2
(45) Date of Patent: Oct. 30, 2012

(54) HANDLER FOR ELECTRONIC COMPONENTS, IN PARTICULAR ICS, COMPRISING A PLURALITY OF CIRCULATING CARRIAGES THAT ARE GUIDED ALONG A CIRCULATING TRACK

(75) Inventors: Stefan Thiel, Rosenheim (DE); Andreas Wiesböck, Stephanskirchen (DE); Alexander Bauer, Rosenheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 254 days.

(21) Appl. No.: 12/681,735

(22) PCT Filed: Sep. 25, 2008

(86) PCT No.: PCT/EP2008/008157
§ 371 (c)(1),
(2), (4) Date: Apr. 5, 2010

(87) PCT Pub. No.: WO2009/046884
PCT Pub. Date: Apr. 16, 2009

(65) Prior Publication Data
US 2010/0219044 A1    Sep. 2, 2010

(30) Foreign Application Priority Data
Oct. 5, 2007 (DE) .......................... 10 2007 047 596

(51) Int. Cl.
*B65G 47/26* (2006.01)
(52) U.S. Cl. ................ 198/471.1; 198/478.1; 198/803.5

(58) Field of Classification Search ............... 198/459.2, 198/468.2–468.5, 469.1–472.1, 478.1, 479.1, 198/867.02–867.08, 803.3–803.9, 803.1
See application file for complete search history.

(56) References Cited

U.S. PATENT DOCUMENTS

| | | | |
|---|---|---|---|
| 4,633,148 A | 12/1986 | Prucher | |
| 5,074,397 A * | 12/1991 | Mukai et al. | 198/343.1 |
| 5,412,314 A | 5/1995 | Fukunaga et al. | |
| 5,954,189 A * | 9/1999 | Averill | 198/803.5 |
| 5,969,537 A | 10/1999 | Kanno et al. | |
| 6,148,721 A * | 11/2000 | Hellmeier et al. | 101/35 |
| 6,876,896 B1 | 4/2005 | Ortiz et al. | |
| 7,540,369 B2 * | 6/2009 | Momich | 198/418 |
| 2002/0112939 A1 * | 8/2002 | Sumi et al. | 198/377.08 |
| 2004/0124068 A1 * | 7/2004 | Berndtsson | 198/608 |
| 2007/0080703 A1 | 4/2007 | Ding | |

FOREIGN PATENT DOCUMENTS

| | | |
|---|---|---|
| DE | 19805718 A1 | 8/1998 |
| DE | 10 2004 031 987 | 7/2004 |
| GB | 647284 | 12/1950 |

(Continued)

OTHER PUBLICATIONS

International Search Report for PCT/EP2008/008157, mailed Apr. 6, 2009.

*Primary Examiner* — Mark A Deuble
(74) *Attorney, Agent, or Firm* — Nixon & Vanderhy P.C.

(57) ABSTRACT

The invention relates to a handler for electronic components, in particular IC's, having a plurality of circulating carriages (10) that are guided along their circulating track by means of a stationary, annular guide device (9) consisting of at least one circulating guide rail. Retaining units (12) are provided on the circulating carriages (10), said units retaining the components (43) to be tested.

19 Claims, 11 Drawing Sheets

FOREIGN PATENT DOCUMENTS

| | | |
|---|---|---|
| JP | 6179172 | 6/1994 |
| JP | 9257873 | 10/1997 |
| JP | 9304474 | 11/1997 |
| JP | 10200291 | 7/1998 |
| JP | 10227828 A | 8/1998 |
| JP | 200360393 A | 2/2003 |
| JP | 2005302918 A | 10/2005 |
| WO | 2007/097899 | 8/2007 |

* cited by examiner

HANDLER FOR ELECTRONIC COMPONENTS, IN PARTICULAR ICS, COMPRISING A PLURALITY OF CIRCULATING CARRIAGES THAT ARE GUIDED ALONG A CIRCULATING TRACK

This application is the U.S. national phase of International Application No. PCT/EP2008/008157, filed 25 Sep. 2008, which designated the U.S. and claims priority to German Application No. 10 2007 047 596.0, filed 5 Oct. 2007, the entire contents of each of which are hereby incorporated by reference.

The invention relates to a handler for electronic components, in particular ICs, comprising a plurality of circulating carriages that can move along a circulation path, each having at least one holding device for holding a component, and comprising guidance means for guiding the circulating carriages along the circulation path and a drive device for moving the circulating carriages, according to the preamble of claim 1.

Electronic components, such as ICs for instance, are usually tested to check that they are working before being fitted on printed circuit boards, for example, or used in other ways. Here, a handling device, commonly called a "handler", carries the components to be tested to a test head of a test device, where they make contact with corresponding contacts of the test head, and, after the test procedure is carried out, are sorted as a function of the test results.

Handlers normally work in such a way that the components supplied via a loading station are initially picked up by holding devices or "plungers", which are designed as vacuum suction cups, whereupon the components are then conveyed to another position and aligned such that they can be pushed further forwards by the plungers in a straight line to contact-making devices in the form of contact sockets, which are electrically connected to a test head of a test device. If the temperature of the components needs to be controlled, this can be done both before placing the components on the holding devices and also during that time period in which the components are situated on the holding devices. It is also possible to use centring means to centre the components on the holding devices in order to ensure precise positioning of the components relative to the contacts of the contact socket. Furthermore, it is also known to use position detection devices, which usually work by optoelectronic means, to detect the precise position of the components located on the holding devices, or to use cameras to inspect the components. Once the test procedures have been carried out, the holding devices take the components away from the contact sockets again and position them in such a way that they can be removed from the handler via an unloading station and sorted as a function of the test result.

In order to be able to carry out the component testing as efficiently as possible, it is crucial that the handlers work at very high speeds, i.e. that maximum possible throughputs are achieved.

A central handling unit having a central section shaped as a rectangular block, on which are provided a plurality of plunger-like movable holding devices in the form of vacuum suction cups, is already known for this purpose from DE 10 2004 031 987 A1, for example. Here, a first group of holding devices is arranged at right angles to a second group of holding devices. It is thereby possible to move the components both in a vertical direction and, after rotating the central section through 90°, in a horizontal direction. With handlers of this type, however, there is only limited scope to increase the throughput because of time losses inherent to the design.

In addition, US 2007/0080703 A1 discloses a handler, which is used for optical inspection of the contacts of semiconductor components. An eight-arm rigid turret is used in the device disclosed here. The components to be inspected are here held on the exposed outer ends of the turret arms, which extend radially outwards, and moved along a circular circulation path by stepped rotation of the turret.

U.S. Pat. No. 5,412,314 A discloses a handler according to the preamble of claim 1. In this handler, the circulating carriages are conveyed by a flat roller conveyor in the area of the test station. In order to be able to carry the circulating carriages in a loop, a second, parallel roller conveyor having driven rollers is provided beneath this roller conveyor, this second conveyor being connected to the top conveyor by means of two elevating devices. In this system, the lateral movement of the circulating carriages is achieved by means of some of the rollers having a V-shaped cross-section and the circulating carriages having a matching V-shaped groove on their underside, in which the rollers engage.

The object of the invention is to create a handler of the type cited in the introduction, which enables particularly steady and precise guidance of the circulating carriages and time-optimized handling of the components.

This object is achieved according to the invention by the features of claim 1. Advantageous embodiments of the invention are described in the other claims.

According to the invention, the circulating carriages are guided along their circulation path by means of a stationary, annular guidance device, which comprises at least one guide rail formed as a continuous loop.

Particularly steady and precise guidance of the circulating carriages along their circulation path can be realised using the handler according to the invention. In addition, positioning at the individual stations that the circulating carriages must pass through can be performed very precisely and at high speeds, thereby enabling time-optimized handling of the components.

According to an advantageous embodiment, the circulating carriages can be moved independently of each other along the circulation path such that the mutual separation of the circulating carriages is variable. This enables a significant increase in the throughput of components through the handler when testing the components. By holding the components on circulating carriages that can be moved along the circulation path independently of each other, i.e. without mutual rigid coupling, it is possible to perform the following handling steps in a time-optimized manner and in parallel with each other:

in a pick-up station, picking up the components to be tested from the loading station by means of the holding devices, in an alignment station, if necessary aligning the components on the holding devices, in a test station, conveying the components to a test head and conveying the components away from the test head, in an unloading station, removing the components from the handler.

Circulating carriages that have already finished one of these procedures can be moved into a wait position immediately adjacent to the next handling station, so that when the procedure in this next handling station is finished, it is only necessary to travel minimum distances in order to move these components to this next handling station. The downtimes within the handler can thereby be reduced to an absolute minimum. It is particularly advantageous here that the circulating carriages can always be moved onwards in the same direction of circulation.

Alternatively, however, it is also possible to drive the circulating carriages so that they move in both one and the other direction of circulation.

According to an advantageous embodiment, the guidance device comprises two annular guide rails (guides), which are spaced laterally apart in two mutually parallel vertical planes. This results in a handler in which the circulating carriages can circle about a horizontal centre axis of the guidance device. The lateral separation of the two annular guide rails also enables an extremely precise mounting of these circulating carriages. As an alternative to this, however, it is also possible to arrange the two annular guide rails in mutually parallel horizontal planes, so that the circulating carriages are guided about a vertical centre axis. Although it is practical, it is, however, not absolutely essential that the two guide rails have the same diameter. Furthermore, it is also conceivable that the guidance device does not have two guide rails that are physically separated from each other, but that a single, connected annular guide rail is used to guide the circulating carriages. For instance, the circulating carriages could be mounted only on one side on one such guide rail, if this guide rail and the circulating carriages have a suitably rigid design.

As an alternative to this, it is also possible to move the circulating carriages not along a circular circulation path but along a differently shaped path, for example a rectangular circulation path.

According to an advantageous embodiment, the circulating carriages are mounted on the two annular guide rails in the edge areas of their opposite sides. Particularly precise guidance of the circulating carriages can be achieved thereby.

According to an advantageous embodiment, the guide rails are composed of guide ridges arranged in a circular ring, where the circulating carriages have guide jaws that engage over the guide ridges. Precise guidance of the components can be realised relatively easily by this means. As an alternative to this, however, it is also possible for the guide rails to be composed of grooves arranged in a circular ring, which are provided, for example, in the side areas of the handler, where the circulating carriages could then have protruding guide elements that engage in the grooves.

According to an advantageous embodiment, the handler has two to eight circulating carriages, in particular three to five circulating carriages. The number of circulating carriages can vary significantly, however, depending on the application and the specific type of handler. Hence it is also possible to provide more than eight circulating carriages. For many applications, however, three or four circulating carriages should probably be regarded as particularly advantageous as a balance between particularly efficient operation on one hand, and minimum complexity of the handler on the other hand.

According to an advantageous embodiment, the drive device has a plurality of drive motors for moving the circulating carriages, with each circulating carriage being operatively connected to its own drive motor. This makes it possible to move each circulating carriage independently of another circulating carriage, so that positioning of each circulating carriage at specific positions along the circulation path is possible in a particularly time-optimized manner. As an alternative to this, it is also possible to couple together one or more groups of circulating carriages, in order to use the same drive motor to move this/these group(s).

According to an advantageous embodiment, each circulating carriage is operatively connected to the assigned drive motor by means of a separate drive shaft and a drive arm that extends from the drive shaft out to the assigned circulating carriage, where the drive shafts of the individual circulating carriages are arranged inside each other and are able to rotate about a common centre axis. An extremely compact, space-saving arrangement can be realised by this means. As an alternative to this, an embodiment is also possible in which the circulating carriages can be moved by linear motors, which are operatively connected to the annular guidance device.

According to an advantageous embodiment, at least one of the drive shafts acts as a bearing mount for at least one other drive shaft. An extremely compact, space-saving arrangement having a small number of parts can be realised by this means.

The invention is described in greater detail below with reference to the drawings by way of example, in which.

Figure 1:
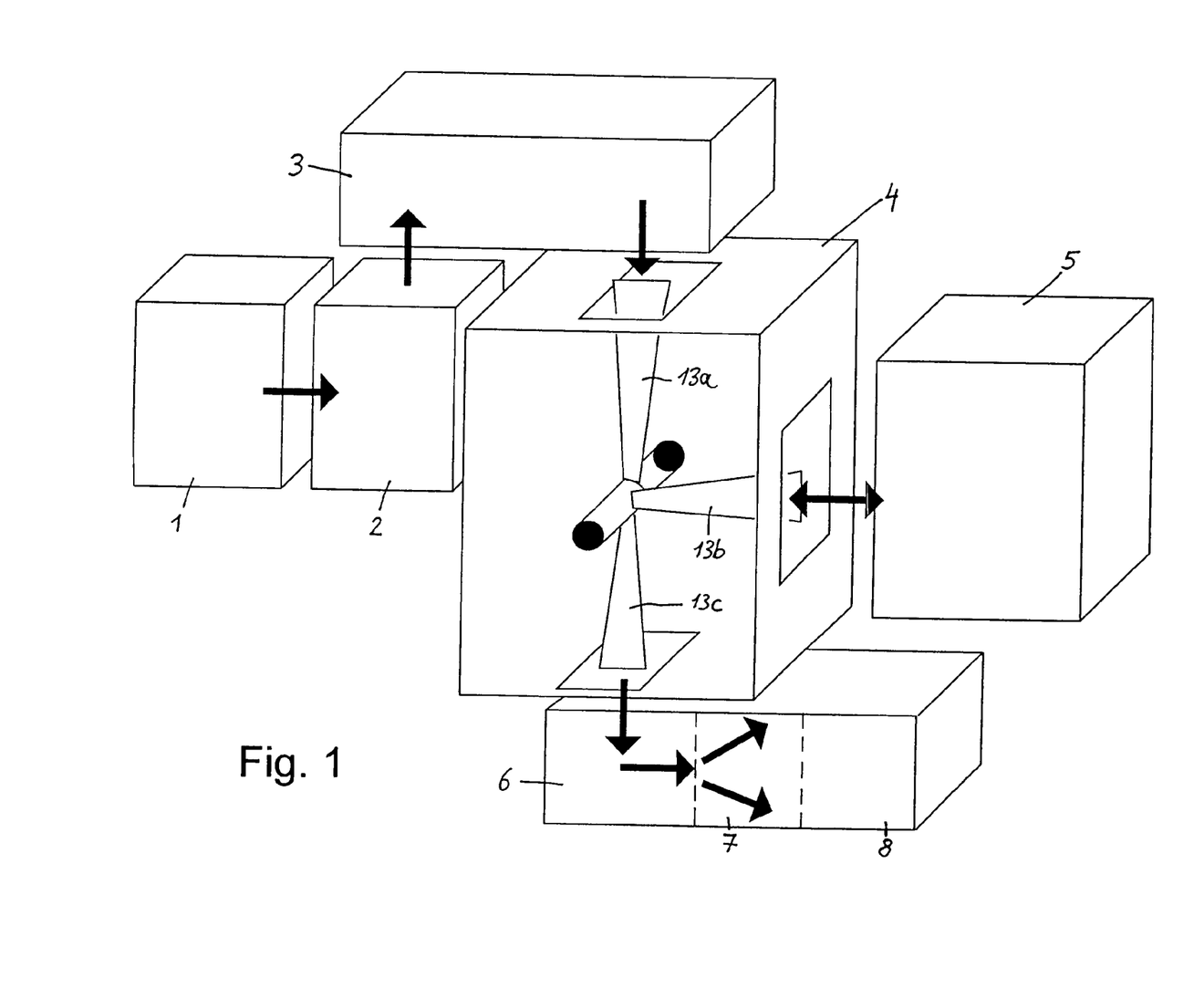
FIG. 1: shows a schematic diagram of the handler according to the invention and surrounding devices or modules, which are used in the testing of electronic components.

First, with reference to FIG. 1, a system for testing electronic components in the form of ICs (semiconductor components containing integrated circuits) is outlined and described by way of example. In the diagram, the arrows indicate the path traveled by the components.

The components are first supplied to a loading unit 1. The loading unit 1 conveys the components first to a temperature control chamber 2 in order to control their temperature at a preset level inside the temperature control chamber 2. This temperature can lie between −60° C. and +200° C. for example. The temperature can be controlled here by means of convection and/or conduction. Once the components to be tested have been brought to the desired temperature in the temperature control chamber 2, they are removed from the temperature control chamber 2 by a conveying unit 3, which may be a pick-and-place module for example, and carried to a handler 4 (central handling unit). The handler 4 contains the necessary devices for picking up and holding the components, an additional component temperature-control facility, if applicable, and a component-moving device for bringing the components to a test head 5, and once the test procedure is finished, to take them away again from the test head 5. In addition, the handler 4 may contain specific devices in order to affect the components to be tested in a specific way, for example, to exert accelerations, pressure or tilting. The test head 5 is engaged on the handler 4 in a known manner. The test head 5 is part of an electronic test device, which is used to test the components and analyse the test results.

Once the test is finished, the components are taken away again from the test head 5 by the handler 4 and carried by an unloader 6 (or pick-and-place module) to a sorting unit 7. In the sorting unit 7, the components are sorted as a function of the test result. Then the components reach an unloading station 8.

The temperature control chamber 2 arranged outside the handler 4 is merely optional. If there is no need to control the temperature of the components to be tested, such a temperature control chamber 2 can be dispensed with. Furthermore, it is also possible to control the temperature of the components to be tested inside the handler 4 in addition to, or as an alternative to, the temperature control chamber 2. Moreover, the components do not need to be delivered to the handler 4 via the conveying unit 3, in the form of a pick-and-place module, but can be delivered by means of gravity as is known to the person skilled in the art. In this case, the handler is called a "gravity handler".

The design and operation of the handler 4 according to the invention is described in greater detail below with reference to FIGS. 2 to 16.

Figure 2:
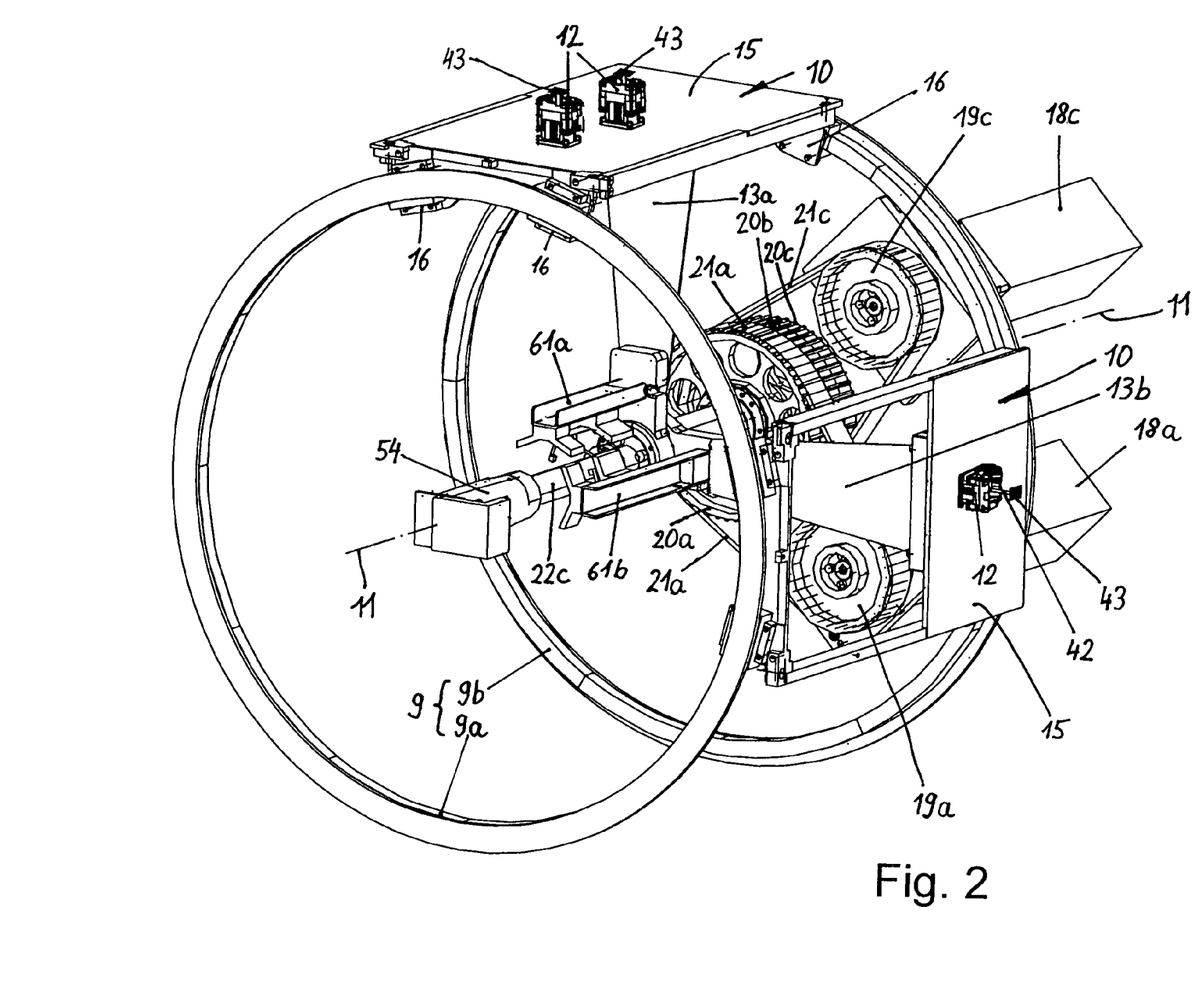
FIG. 2: a perspective view of the guide rails and of parts of the circulating carriages and drive means of the handler according to the invention, with only two circulating carriages being shown and a plurality of components not being shown in order to improve clarity.

The handler 4 comprises a guidance device 9 having two annular, stationary guides in the form of guide rails 9a, 9b, on which a plurality of circulating carriages 10 are moveably mounted. In the exemplary embodiment illustrated, the two guide rails 9a, 9b are each composed of circular rings of the same diameter, which are arranged in mutually parallel, physically separate vertical planes, and which extend about a common centre axis 11. The mutual separation of the guide rails 9a, 9b is approximately equal to the width of the circulating carriages 10, so that at the sides, these circulating carriages do not protrude, or only protrude negligibly, beyond the two guide rails 9a, 9b. In addition, each guide rail 9a, 9b is composed of circumferential ridge segments, which protrude in a horizontal direction from a supporting structure (not shown in closer detail) supporting the guide rails 9a, 9b towards the respective opposite guide rail. The guide rails 9a, 9b may be arranged, for example, immediately adjacent to two opposite side walls of a housing of the handler 4.

Figure 3:
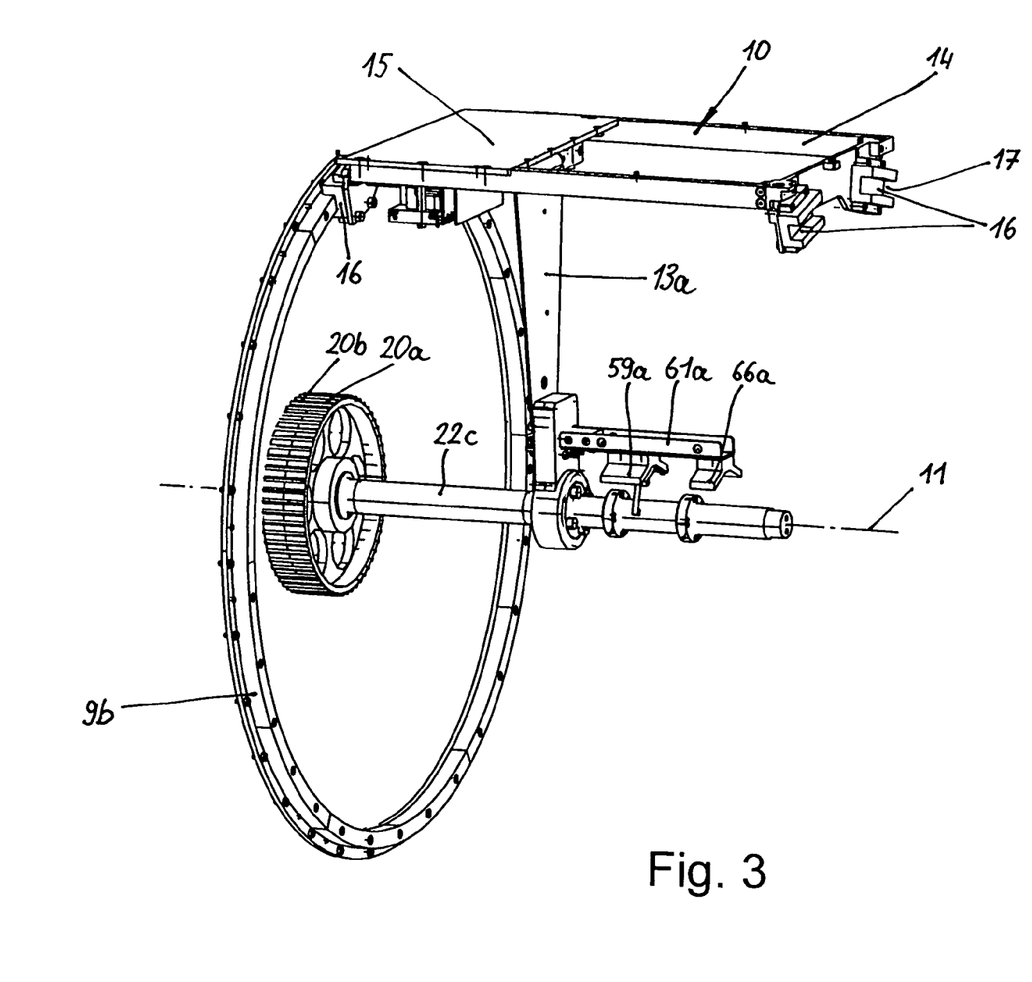
FIG. 3: shows from a different perspective a single guide rail having a partially depicted circulating carriage.

The circulating carriages 10 can be guided along the guide rails 9a, 9b on a circular path around the horizontal centre axis 11 independently of each other, i.e. the mutual separations of the circulating carriages 10 can be varied in the direction of circulation. In the exemplary embodiment, which is described with reference to the figures, three substantially identical circulating carriages 10 are provided. In FIGS. 2 and 3, only two or one circulating carriage 10 is depicted, merely for the sake of clarity. The number of circulating carriages 10 may differ significantly from this, however, depending on the application of the handler 4. For example, it is possible to provide two to eight circulating carriages 10, in particular three to five circulating carriages.

Figure 6:
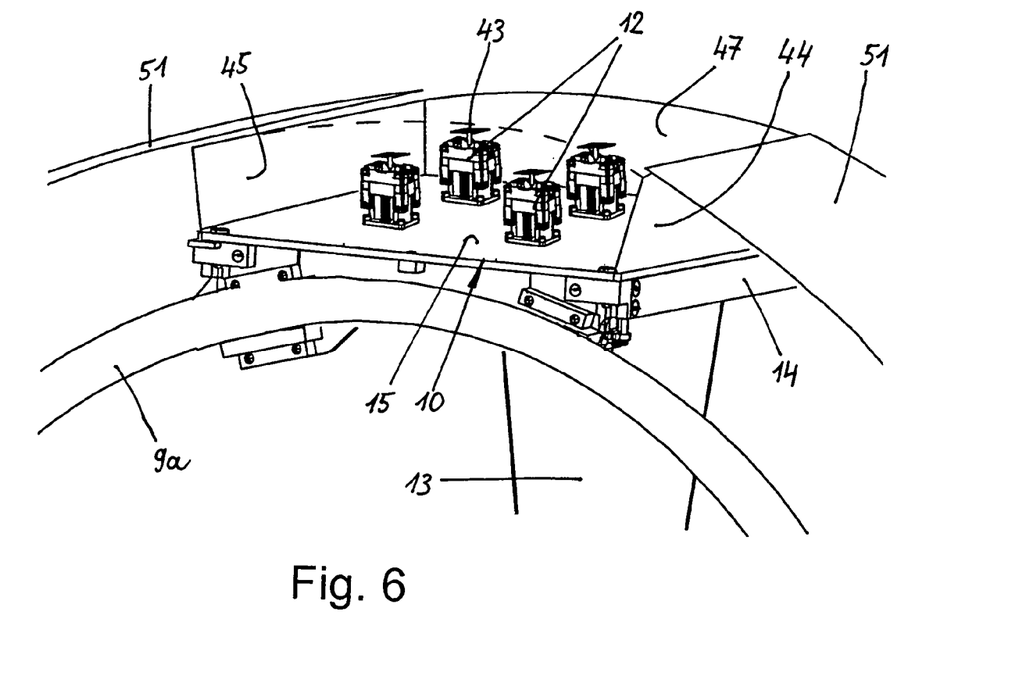
FIG. 6: shows a partial cut-away view of the circulating carriage of FIG. 5, with four holding devices ("plungers") for the components being shown.
Figure 7:
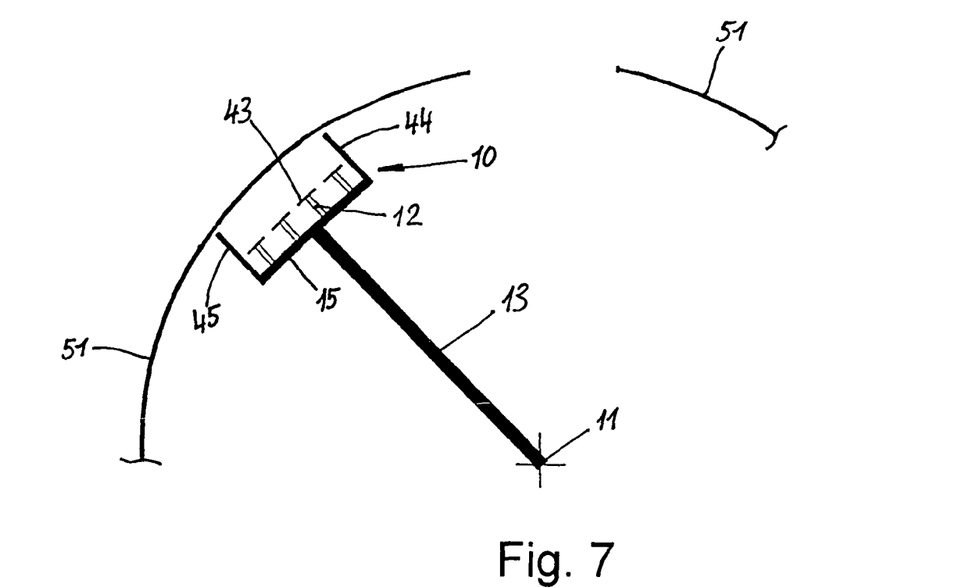
FIG. 7: shows a schematic side view of a circulating carriage with drive arm to illustrate the interaction with an outer cover.
Figure 8:
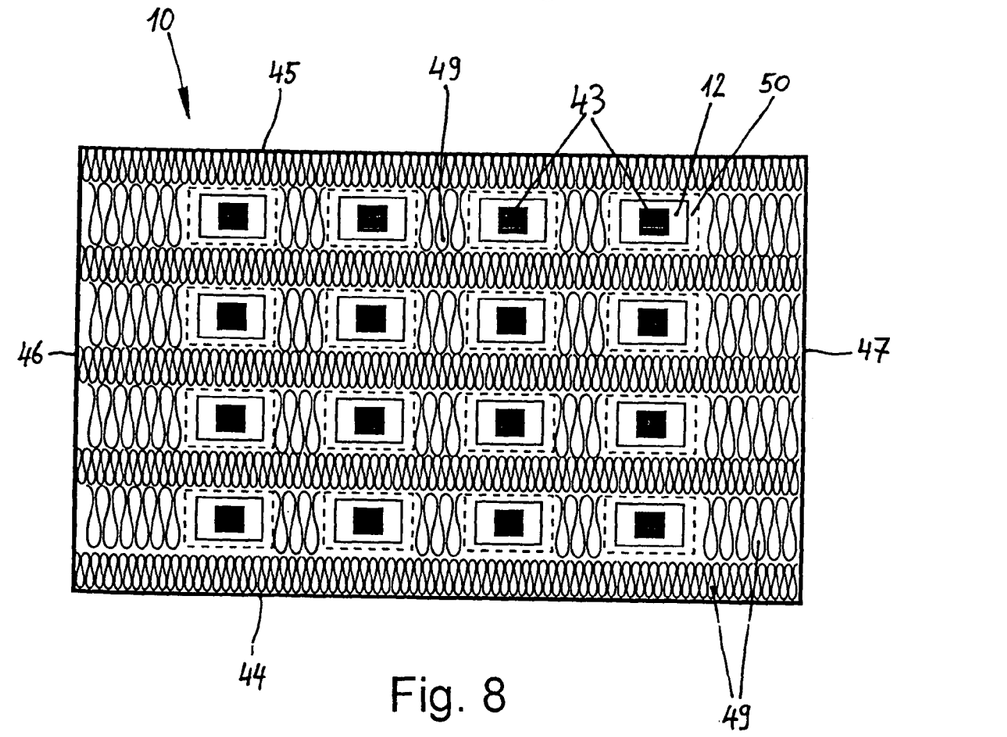
FIG. 8: shows a schematic plan view of a circulating carriage having 16 holding devices.

In the exemplary embodiment shown, as illustrated in FIGS. 7 and 8, fixed to each circulating carriage 10 are sixteen identical holding devices 12 in the form of vacuum suction cups, each of which is used to hold one electronic component 43 to be tested, for example, a semiconductor component (IC). In FIGS. 2 to 6, fewer, or even no, holding devices 12 are depicted, merely for the sake of clarity and to show components arranged behind. It is obviously possible, however, to provide a different number of holding devices 12 on each of the circulating carriages 10 in order to be able to pick up a corresponding number of components 43 at once, convey them to the test head 5 and take them away again from it, whereby particularly high throughputs can be achieved. It can be particularly advantageous to arrange the holding devices 12 in a matrix formation on the circulating carriage 10, for example in the form of a 3×3, 2×4, 4×4 or 5×5 matrix.

It is particularly advantageous if the holding devices 12 can be actuated independently of each other, i.e. separately. It is then possible not to load individual holding devices 12 of a circulating carriage 10 with a component 43, and only to use a subgroup of holding devices 12 or even just a single holding device 12 for the test.

Figure 9:
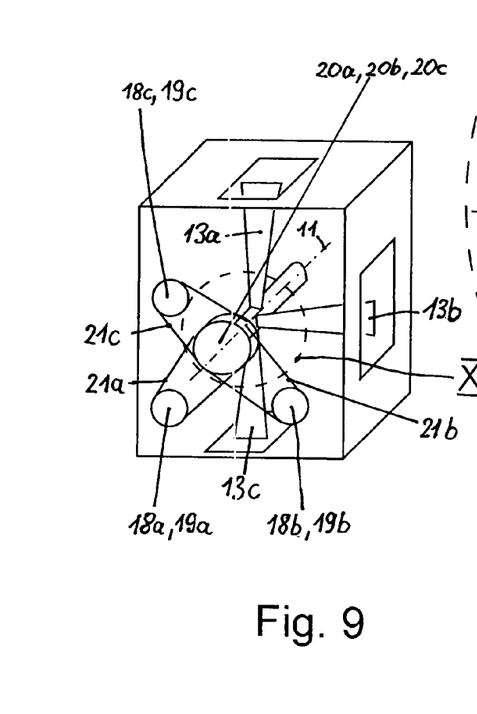
FIG. 9: shows a schematic diagram of the handling device.
Figure 16:
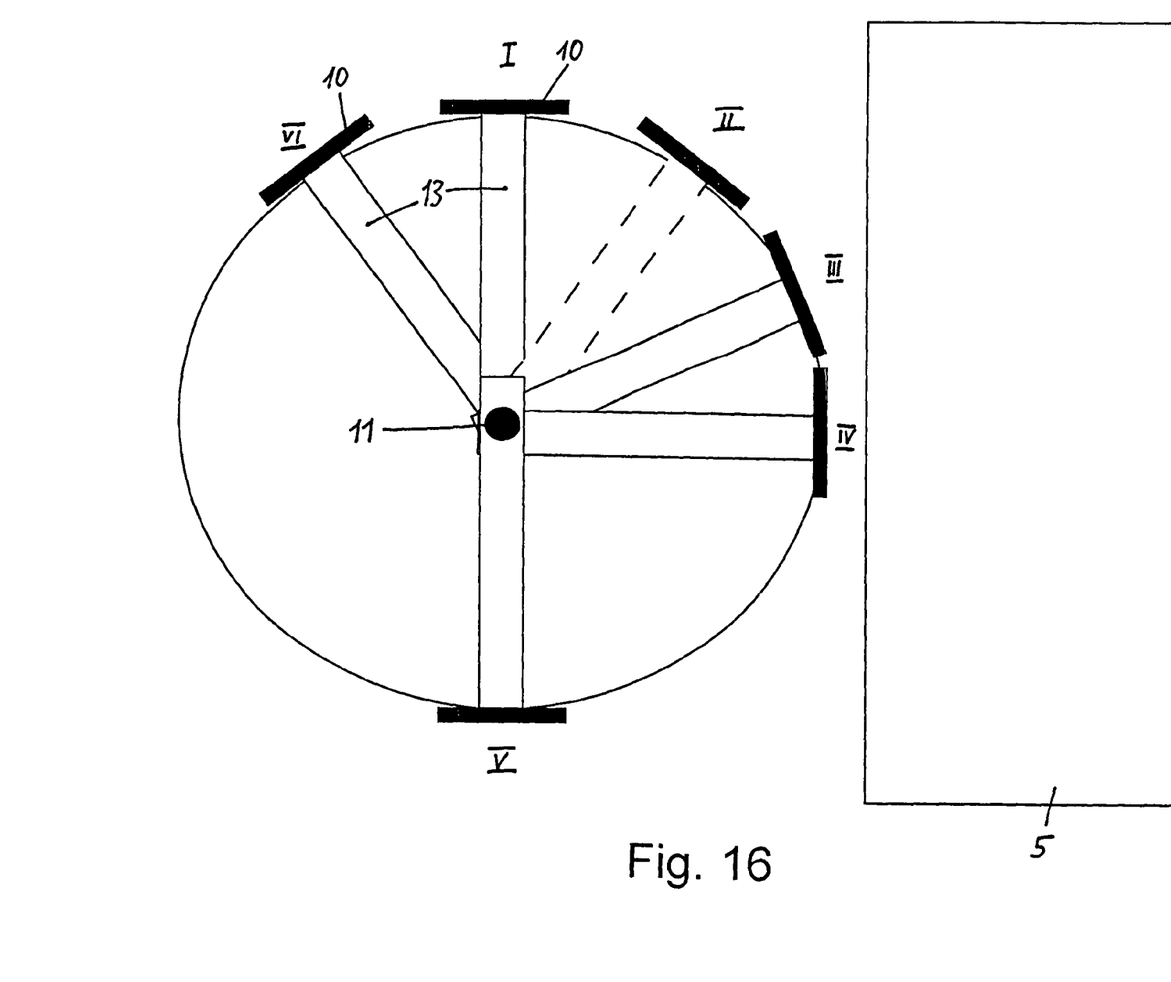
FIG. 16: shows a schematic side view of the handler and a test device to illustrate how the handler works.

In the schematic views of FIGS. 1 and 9, the circulating carriages 10 as such are not shown, but only the assigned drive arms 13 (the individual drive arms are denoted by 13a, 13b, 13c), which extend radially outwards from the centre axis 11 to a circulating carriage 10 in each case, and drive this carriage in the direction of circulation. The key factor, which is also later illustrated by FIG. 16, is that the circulating carriages can move independently of each other into individual positions along the circulation path, so that downtimes, i.e. times in which no components are making contact with the test head 5, are minimized, and the throughput through the handler 4 can be increased.

The circulating carriages 10 have a rectangular frame 14, on which is screwed a two-piece base plate 15. In FIG. 2, the circulating carriage 10 on the side is shown only with one half of the base plate 15 in order to gain a view of the parts located behind.

FIGS. 3 and 6 likewise show only one of the two plate halves. The base plate 15 is used in particular for attaching the holding units 12 and for sealing the circulating carriages 10 radially inwards in order to prevent heat loss in this direction if the temperature of the components is controlled.

As can be seen from FIGS. 2 and 3, two guide jaws 16, which engage over the guide rails 9a, 9b, are fixed to each of the two opposite sides of the frame 14. The guide jaws 16 have a U-shaped cross-section, with their open side facing laterally outwards. The guide grooves 17 of the guide jaws 16 (FIG. 3) are designed to fit the profile of the guide rails 9a, 9b such that the circulating carriages 10 are guided along the guide rails 9a, 9b with practically no play.

The detachable fastening of the base plate 15 on the frame 14 provides the advantage that the base plate 15 together with the holding devices 12 can be replaced easily, for example, if adjustments are required to suit a different surrounding structure.

Figure 5:
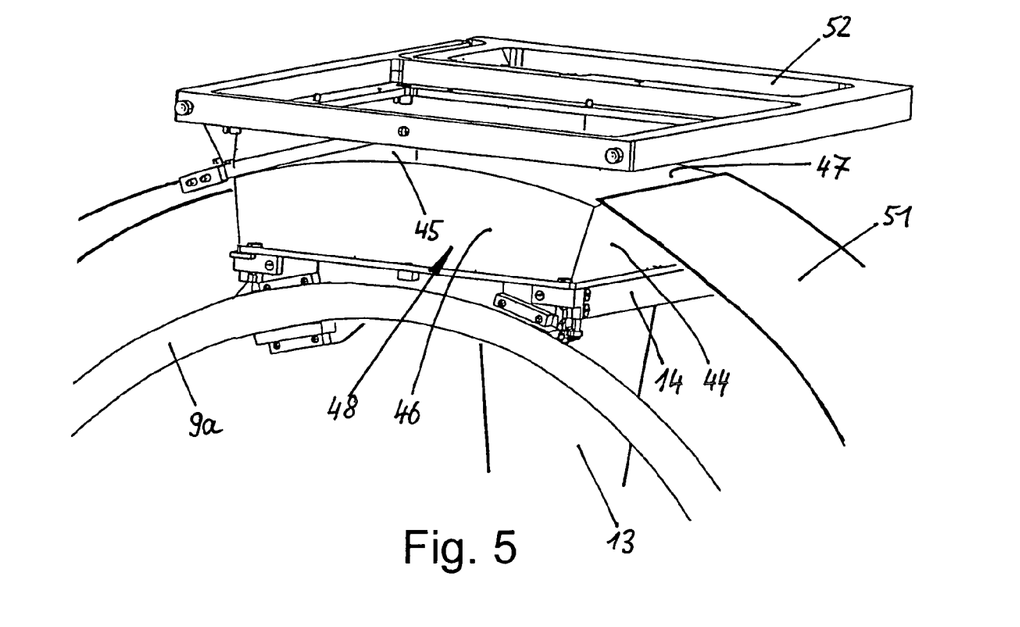

As FIGS. 5 to 7 show, each circulating carriage 10 has a housing 48, which is composed of the base plate 15, a front wall 44, a rear wall 45 and two sidewalls 46, 47. The walls 44-47 together with the flat base plate 15 form a trough-like housing, which is at least substantially closed at the sides and radially inwards, but which is open in the radially outwards direction, i.e. upwards in FIGS. 5 and 6. That part of the holding devices 12 that is shown in FIG. 6, for example, is located entirely inside the housing 48. Using the housing 48, it is possible to design each circulating carriage 10 as an enclosing temperature control chamber for the components 43.

The temperature of the components 43 is advantageously controlled by means of a fluid, which is fed along the drive arm 13 and directed into the respective housing 48. In this case, it is particularly advantageous if, as shown schematically in FIG. 8, the intermediate space between the individual holding devices 12 is filled with thermal insulation 49, and the temperature-controlled fluid is directed systematically to each component 43. As is evident from FIG. 8, it is also possible to arrange the thermal insulation 49 so that small separate chambers 50 are formed around the individual holding devices 12, whose sidewalls are only a short distance from the holding devices 12, so that the space whose temperature is to be controlled by the fluid is very small. Alternatively, however, it is also possible simply to insulate the walls 44-47 appropriately.

When controlling the temperature of the components 43, in order to prevent the heat dissipating radially outwards from the temperature control chambers in an uncontrolled manner, an encircling cover 51 in the form of a stationary, annular cover plate is arranged at a short radial distance outside the circulating carriages 10. The cover 51 covers the circulating carriages 10 completely over their entire circulation path, except in those areas in which the circulating carriages 10 are loaded with components 43, unloaded and moved radially outwards towards the test device. FIGS. 5 and 6 show the loading station in which the cover plates are spaced apart from each other at a distance that enables the components 43 to be placed without hindrance on the assigned holding devices 12.

FIG. 5 also shows a stationary frame 52, which is arranged above the loading aperture. This frame is not of any crucial relevance to the present invention, however.

The design of the housing 48 as temperature control chambers is merely optional. If the temperature of components 43 does not need to be controlled, such temperature control chambers can be dispensed with.

Each circulating carriage 10 can be made to circulate along the guide rails 9a, 9b by its own drive arm 13. The drive arms 13 are rigid sheet-metal parts, which are designed to be very stiff in the drive direction, i.e. the direction of circulation. In the lateral direction, on the other hand, the drive arms 13 do not need to have any particular rigidity, because they do not need to perform any supporting function or lateral guidance function for the circulating carriages 10. The sheet thickness can therefore be made correspondingly small, so that the drive arms 13 can have a low mass. In addition, such drive arms 13 can be used to absorb lateral tolerances. The drive arms 13 are arranged in the area between the two guide rails 9a, 9b, and extend from the radially inner face of the circulating carriages 10 towards the centre axis 11.

Figure 4:
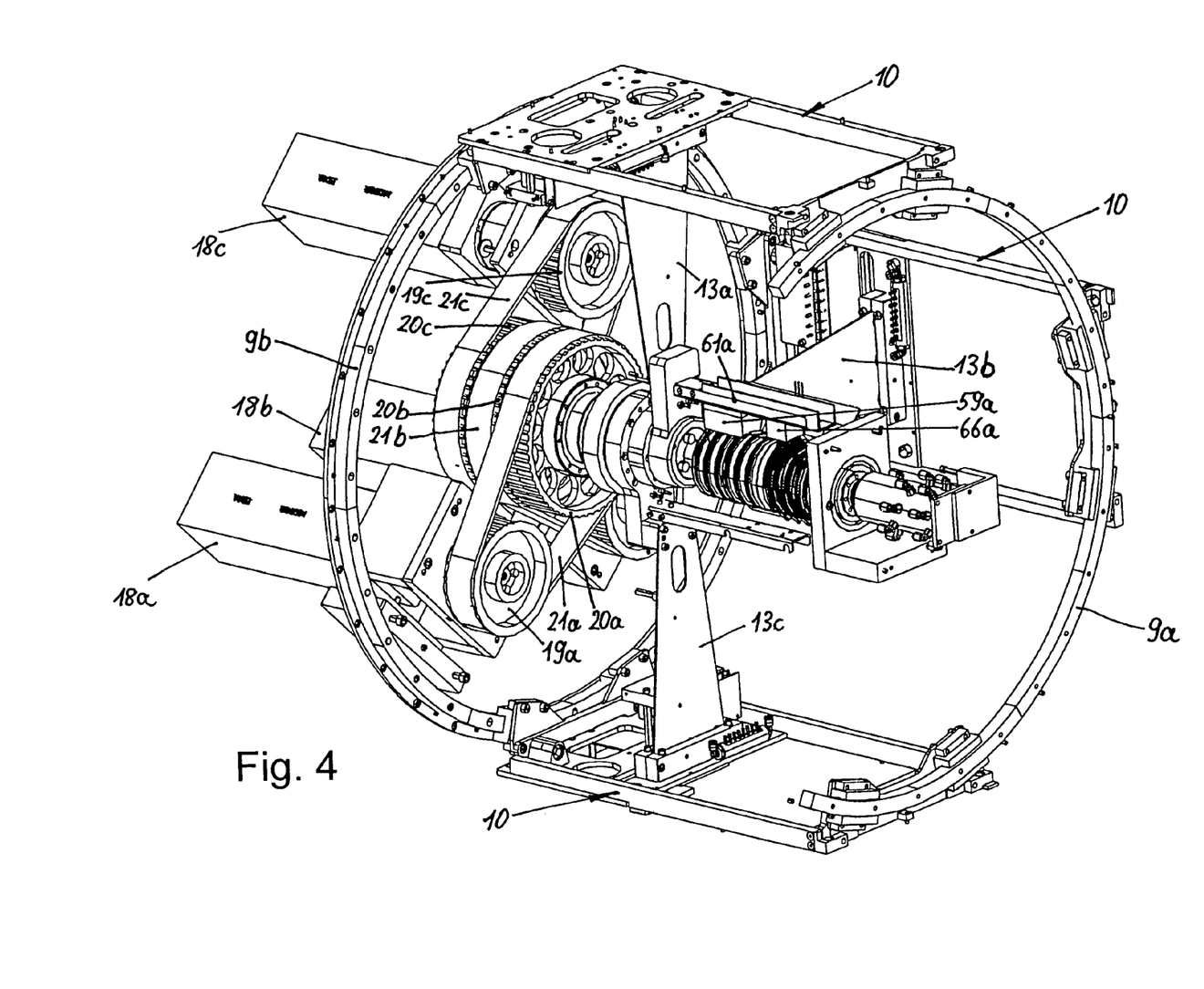
FIG. 4: shows a perspective view of the guide rails and of parts of the circulating carriages and drive means, containing additional details compared with FIG. 2, FIG. 5: shows a perspective, partially schematic view of a circulating carriage in the region of the loading aperture.
Figure 10:
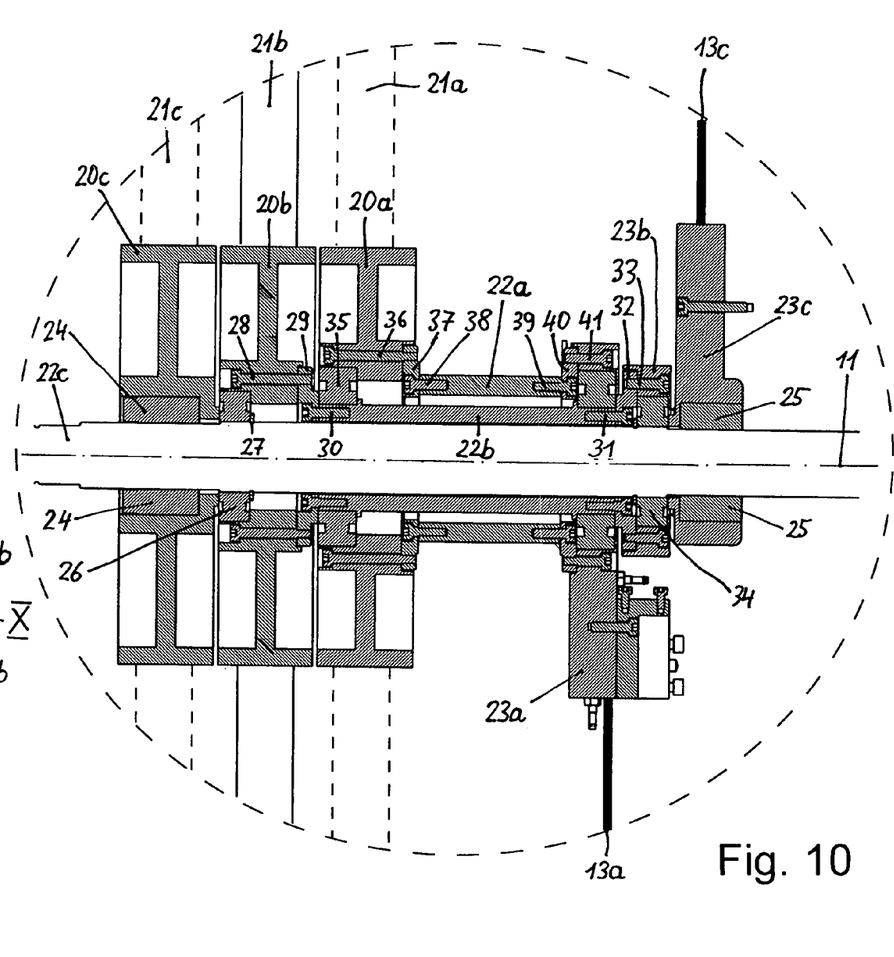
FIG. 10: shows a longitudinal section through the drive shafts in the region of FIG. 9, FIG. 11: shows a longitudinal section through the drive shafts, the electrical power/data transmission device and the vacuum/fluid supply device.

As is evident particularly from FIGS. 2, 4 and 10, each drive arm 13a, 13b, 13c is driven by its own drive device in order to be able to move the circulating carriages 10 independently of each other.

The drive device for the drive arm 13a essentially comprises a drive motor 18a, a drive sprocket 19a driven by this, a central sprocket 20a, which is rotationally coupled to the drive sprocket 19a via a toothed belt 21a, and a drive shaft 22a, which is fixed to the central sprocket 20a at one end and to a coupling piece 23a of the drive arm 13a at the other end so that they co-rotate.

The drive device for the drive arm 13b comprises a drive motor 18b, a drive sprocket 19b that can be set in rotation by this, a central sprocket 20b, which is rotationally coupled to the drive sprocket 19b via a toothed belt 21b, and a drive shaft 22b, which is fixed to the central sprocket 20b at one end and to a coupling piece 23b of the drive arm 13b at the other end so that they co-rotate.

The drive device for the drive arm 13c comprises a drive motor 18c, a drive sprocket 19c that can be set in rotation by this, a central sprocket 20c, which is rotationally coupled to the drive sprocket 19c via a toothed belt 21c, and a drive shaft 22c, which is fixed to the central sprocket 20c at one end and to a coupling piece 23c of the drive arm 13c at the other end so that they co-rotate.

Figure 11:
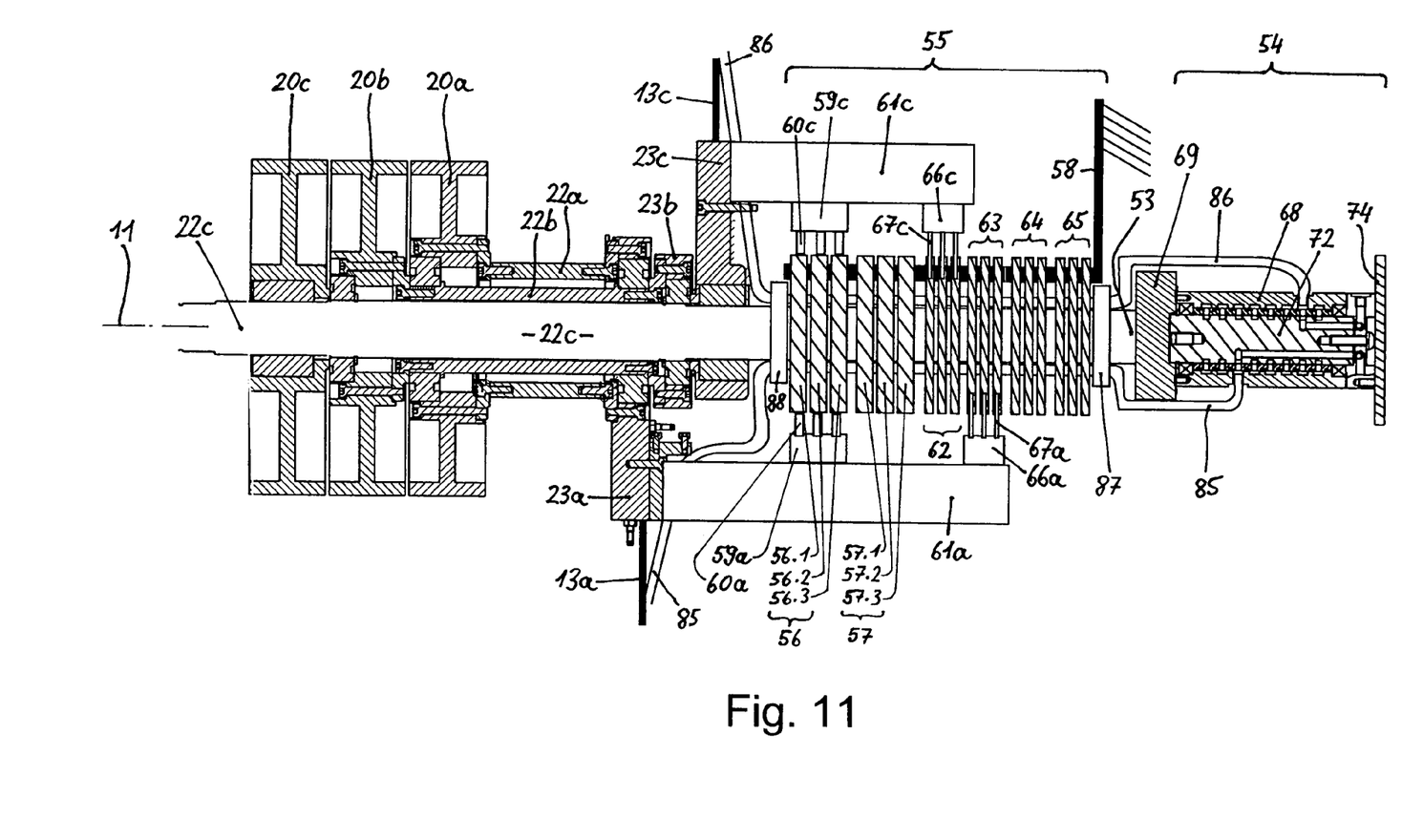

The three drive shafts 22a, 22b, 22c, as shown in FIGS. 10 and 11, are arranged inside each other and can rotate about the common horizontal centre axis 11. The drive shaft 22c constitutes the innermost drive shaft, and is mounted in its left-hand (as shown in FIG. 11) end region on the frame of the handler 4 in a manner that is not shown in greater detail. At the right-hand end 53 of the innermost drive shaft 22c is fixed a bearing ring 69, which holds the drive shaft 22c so that it can rotate on a fixed supporting structure of the handler.

A substantially cylindrical vacuum/fluid transmission device 54, which is aligned with the drive shaft 22c, is flange-mounted to the bearing ring 69, and is described in greater detail below.

The co-rotational connection between the central sprocket 20c and the innermost drive shaft 22c can be achieved by a key-and-slot connection, as shown in FIG. 10, where key elements 24 engage in matching slots, which are provided in the central sprocket 20c at one end and in the drive shaft 22c at the other. Alternatively, other connections are also possible, in particular clamping devices between drive shaft 22c and sprocket 20c.

Likewise, the co-rotational connection between the coupling piece 23c of the drive arm 13c and the innermost drive shaft 22c, can be made by a key-and-slot connection, where key elements 25 engage in matching slots, which are provided in the coupling piece 23c at one end and on the drive shaft 22c at the other.

The central sprocket 20b is mounted on the innermost drive shaft 22c so that it can rotate, and arranged immediately adjacent to the central sprocket 20c. In the illustrated exemplary embodiment, a ball bearing 26 is used as the bearing for the central sprocket 20b. The inner bearing seat of the ball bearing 26 is axially defined on one side by the position of the central sprocket 20c and on the other side by a locating ring 27, which lies in a circumferential groove of the innermost drive shaft 22c.

The central sprocket 20b is fixed to a flange piece 29 by screws 28, and this flange piece to the drive shaft 22b by screws 30, so that they co-rotate. This centre drive shaft 22b has a tubular design and surrounds the innermost drive shaft 22c with some clearance, so that the centre drive shaft 22b can rotate relative to the innermost drive shaft 22c.

At the opposite end, the centre drive shaft 22b is again fixed to a flange piece 32 by screws 31, and this flange piece to the coupling piece 23b by screws 33, so that they co-rotate. The coupling piece 23b is again mounted on the innermost drive shaft 22c by means of a ball bearing 34 so that it can rotate.

The central sprocket 20a is in turn arranged immediately beside the central sprocket 20b, and mounted on the centre drive shaft 22b by means of a ball bearing 35 so that it can rotate. The central sprocket 20a is connected to a flange piece 37 by screws 36, and this flange piece to the drive shaft 22a by screws 38, so that they co-rotate. The tubular drive shaft 22a surrounds the centre drive shaft 22b with radial clearance and can rotate relative to it. At the opposite end, the drive shaft 22a is fixed to a flange piece 40 by screws 39, and this flange piece is fixed to the coupling piece 23a of the drive arm 13a by screws 41, so that they co-rotate.

It is evident from FIGS. 10 and 11 that the central sprockets 20a, 20b, 20c at one end and the drive arms 13a, 13b, 13c at the other end are arranged immediately beside each other, so that a very compact drive unit can be achieved, which enables mutually independent movement of the individual drive arms 13a, 13b, 13c and hence of the circulating carriages 10.

It is immediately obvious to the person skilled in the art that, in the manner described, not only three drive shafts, but even four or more drive shafts can be arranged inside each other without great extra complexity in the structural design, if it were intended to drive four or more circulating carriages 10 independently of each other by their own drive means.

As shown in FIG. 11, an electrical power/data transmission device 55 is arranged in the region of the innermost drive shaft 22c between the drive arms 13 and the vacuum/fluid transmission device 54, via which, on the one hand, power can be supplied to the circulating carriages 10 and, on the other hand, data can be transferred between a data processing installation and devices arranged in the area of the circulating carriages 10. Electrical power is needed at different points on the circulating carriages 10, for example, for temperature control i.e. to heat heating coils on the holding devices 12 (vacuum suction cups), for controlling vacuum valves provided on the individual holding devices 12 (for example, if one or more holding devices 12 are not meant to be used), for supplying power to CAN (Controller Area Network) boards mounted on the circulating carriages 10, and for controlling valves for heating and supplying pressure to the individual vacuum suction cups.

Data transfer via the data transmission device serves a range of purposes, in particular transmitting data from temperature sensors and vacuum sensors on the vacuum suction cups, and for communication with the CAN boards by the data processing installation.

The electrical power transmission device comprises, in the exemplary embodiment shown in FIG. 11, two slip-ring groups 56, 57, each having three slip rings 56.1, 56.2, 56.3 and 57.1, 57.2, 57.3 respectively. Although a single slip-ring group would be sufficient for operation, two slip-ring groups are provided in the present case in order to be able to work with two different voltages, for example with 24 Volts and 48 Volts. In FIG. 11, only the left-hand slip-ring group 56 is used. Hence only slip-ring group 56 is described below.

The slip-ring group 56 has three slip rings 56.1, 56.2, 56.3 because a three-conductor power line is used. Each slip ring is assigned to a specific conductor. The individual slip rings are arranged in a fixed manner inside the handler, side by side along the innermost drive shaft 22c about the common centre axis 11, and connected to the individual wires of a CAN bus 58. The drive shaft 22c passes through the centre of the slip rings and the drive shaft 22c is able to rotate relative to the fixed slip rings.

Figure 14:
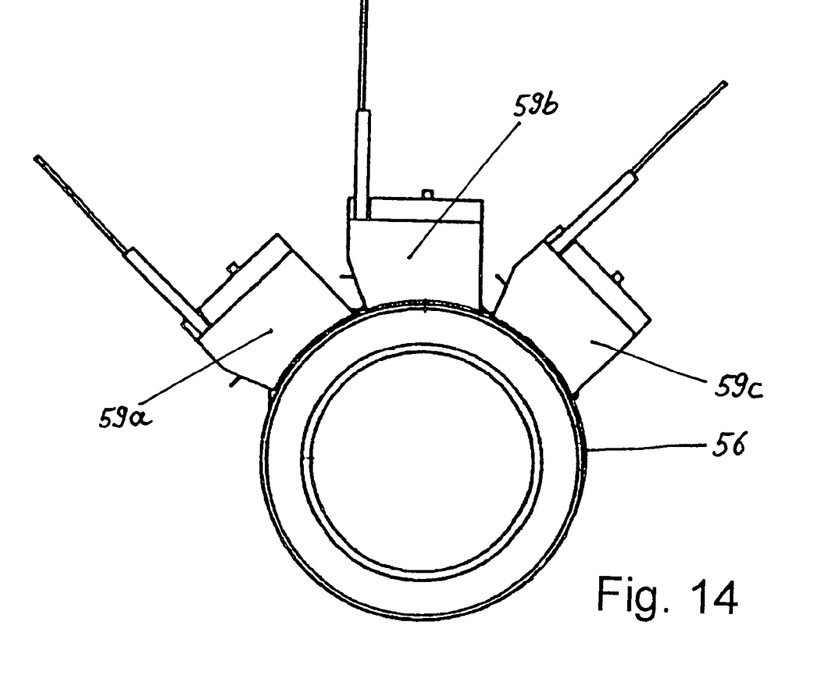
FIG. 14: shows an end-on view of the slip rings and brushes of the electrical power transmission device.
Figure 15:
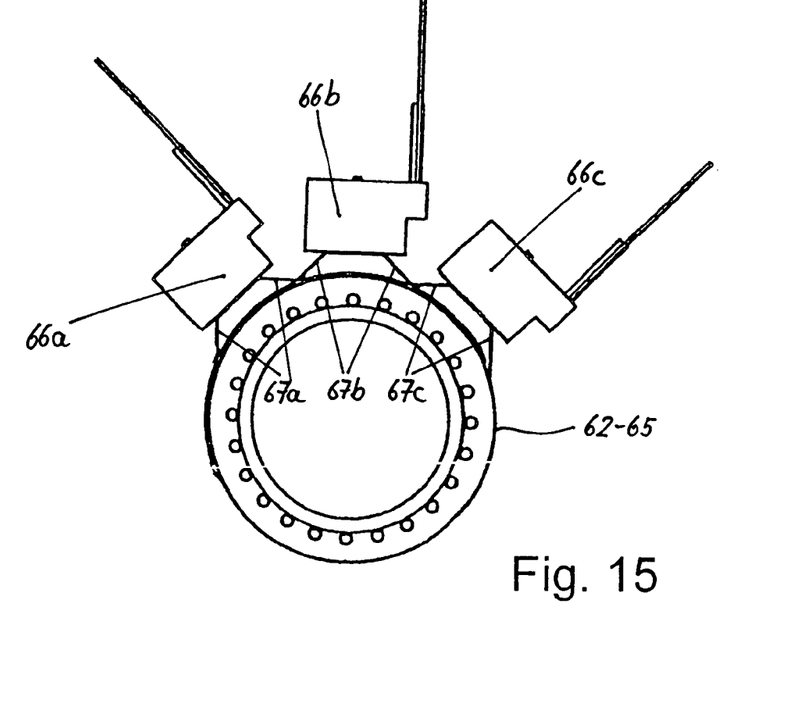
FIG. 15: shows an end-on view of the slip rings and collector contacts of the data transmission device.

Each slip ring 56.1, 56.2, 56.3 is in contact with a number of brush blocks 59a, 59b, 59c equal to the number of circulating carriages 10 (see also FIG. 14). Since there are three circulating carriages 10 in the present case, three brush blocks 59a, 59b, 59c are therefore present, which are arranged at different points along the circumference of the slips rings 56.1, 56.2, 56.3.

Figure 12:
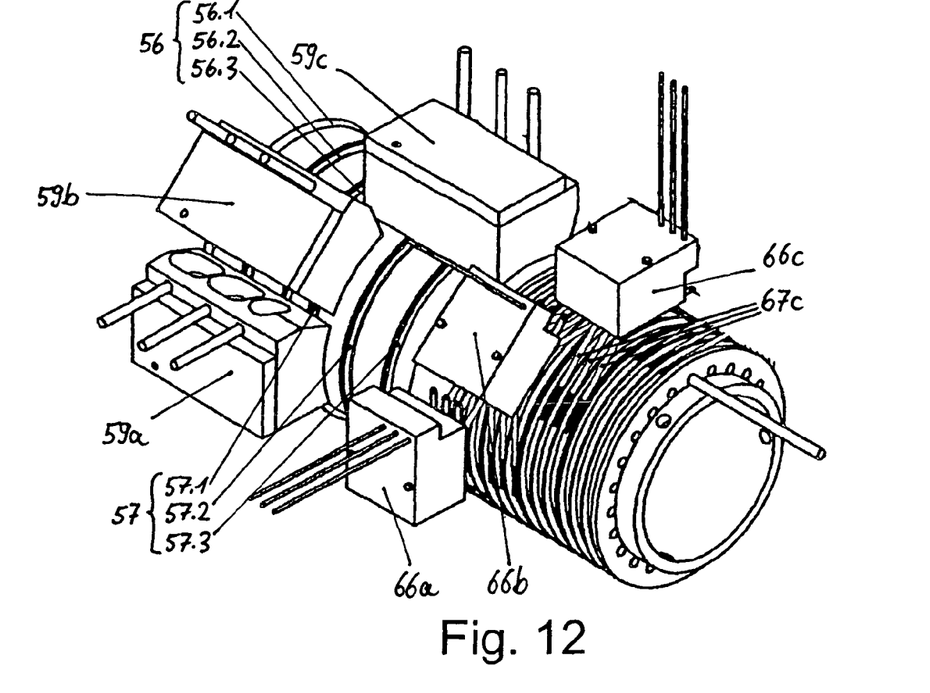
FIG. 12: shows a perspective view of the electrical power/data transmission device.

In FIG. 12, unlike the exemplary embodiment in FIG. 11, the slip-ring block 59c is not in contact with the slip-ring group 56 but with the slip-ring group 57. If, however, only that voltage assigned to slip-ring group 56 is used, then brush block 59c is also located on the slip-ring group 56 in the same manner as brush blocks 59a, 59b. Each brush block 59a, 59b, 59c has a three-conductor brush 60a, 60b, 60c, which are in contact with the assigned slip rings 56.1, 56.2, 56.3, and which can slide over the outer circumferential surface of the assigned slip rings in a known manner.

The brush blocks 59a, 59b, 59c are each fixed to assigned mounting beams 61a, 61b, 61c respectively, which are in turn fixed to the associated coupling pieces 23a, 23b, 23c of the drive arms 13a, 13b, 13c. If the drive arms 13a, 13b, 13c are made to rotate, the brush blocks 59a, 59b, 59c with the assigned brushes hence also move over the circumference of the stationary slip rings 56.1, 56.2, 56.3, whereby they ensure continuous power transmission from a stationary power generating source to the individual circulating carriages 10.

Data transmission to the individual circulating carriages is performed in a similar manner to the electrical power transmission described above. As shown in FIGS. 11 and 12, four slip-ring groups 62, 63, 64, 65 are provided for this purpose. Each of these slip-ring groups has three slip rings. In the same manner as those of the electrical power transmission device, these slip rings are again arranged side by side about the centre axis 11, i.e. about the inner drive shaft 22c, and in a fixed manner inside the handler. Each slip-ring group 62, 63, 64, 65 has three slip-rings, in order to be able to make contact with three different conductors respectively of a data line, which is integrated in the CAN bus 58.

As can be seen from FIGS. 4, 11, 12 and 15, for example, a collector-contact block 66a, 66b, 66c is fixed to each of the mounting beams 61a, 61b, 61c respectively of the individual drive arms 13a, 13b, 13c, with the collector contacts 67a, 67b, 67c of these blocks resting on the slip-ring groups 62, 63, 64, as shown in FIG. 12. The collector contacts 67a, 67b, 67c remain in sliding contact with the assigned slip rings during rotation of the drive arms 13a, 13b, 13c, and by this means enable data transmission from the rotating circulating carriages 10 to a stationary data processing installation via the CAN bus 58.

The brush blocks 59a, 59b, 59c of the electrical power transmission device and the collector-contact blocks 66a, 66b, 66c of the data transmission device are arranged around the circumference of the slip rings in such a way that they do not interfere with each other if the assigned circulating carriages 10 are moved relative to each other so that their mutual separations along the circulation path vary.

Figure 13:
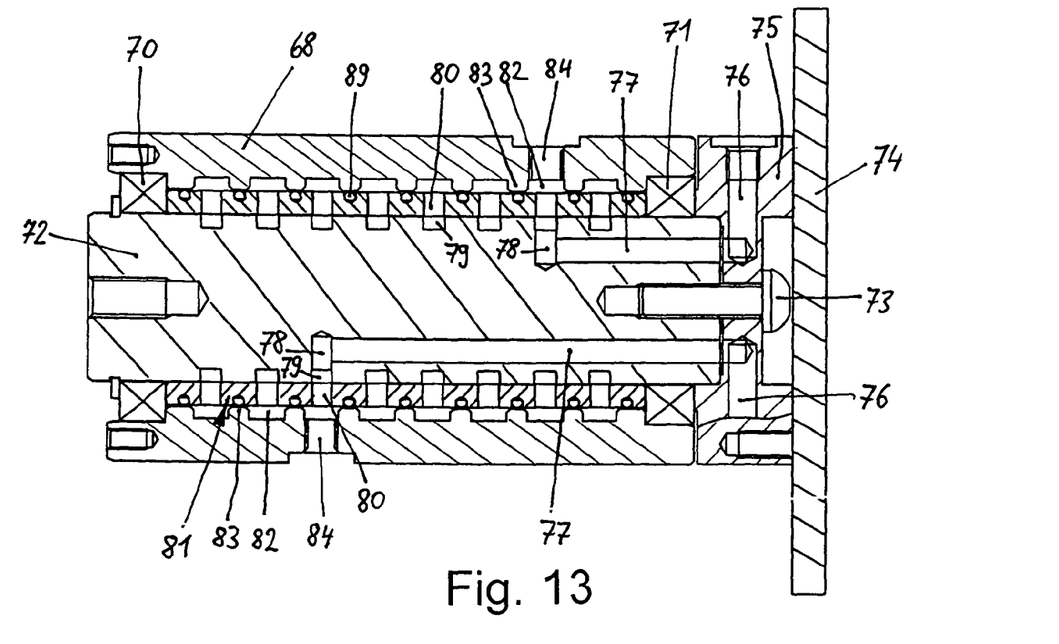
FIG. 13: shows a longitudinal section through the vacuum/fluid transmission device in the region of the centre axis.

The vacuum/fluid transmission device 54 is described in greater detail below with reference to FIGS. 11 and 13.

The vacuum/fluid transmission device 54 comprises a cylindrical housing 68, which is screw-fixed at its end face to the bearing ring 69, and via this is fixed to the inner drive shaft 22c. The housing 68 is designed as a sleeve, and is mounted at the two opposite ends by bearings 71 on a stationary cylindrical central piece 72 so that it can rotate. The central piece 72 is fixed by a screw 73 to a flange piece 74, which in turn can be screw-fixed to a fixed supporting structure of the handler.

The vacuum/fluid transmission device 54 comprises a total of eight channels, in order to supply up to four circulating carriages 10 both with a vacuum for holding the components 43 by suction on the plungers 42 and with a fluid, in particular in the form of purified air, for controlling the temperature of the suction-held components 43. For this purpose, a total of eight radial holes 76 are provided in a cylindrical section 75 of the flange piece 74, which are spaced around its circumference and connected to appropriate lines of a fluid/vacuum supply source of the handler. The radial holes 76 feed into eight assigned axial holes 77 of different lengths, which in turn lead into radial holes 78, which are provided inside the central piece 72. The radial holes 78 feed into assigned annular slots 79 located on the outer circumference of the central piece 72. Each of the eight annular slots 79 is in fluid connection with assigned radial holes 80 located in a sleeve 81, which is arranged in an intermediate space between the central piece 72 and the housing 68 and sits fast on the central piece 72. The radial holes 80 are designed as through-holes, and lead into annular chambers 82, which run around the inner circumferential wall of the housing 68, and which are separated from each other by circumferential ridges 83 that protrude inwards. Sealing rings 89, which interact with the ridges 83, ensure fluid-tight separation of the individual annular chambers 82. Each annular chamber 82 is connected to a radial through-channel 84, into which can be screwed a suitable connector of a vacuum line 85 (FIG. 11) or fluid supply line 86.

As shown in FIG. 11, the vacuum lines 85 and the fluid supply lines 86, which rotate together with the housing 68 of the vacuum/fluid transmission device 54, and hence together with the innermost drive shaft 22c, and hence are stationary relative to the drive shaft 22c, can be threaded close to the drive shaft 22c through the slip rings and through two mounting rings 87, 88 fixed to the drive shaft 22c, and by this means can be fed to the individual drive arms 13a, 13b, 13c.

How the handler 4 according to the invention works is explained below with reference to FIG. 16 by way of example. In position I, which corresponds to the 12 o'clock position and represents the loading station, there is a circulating carriage 10 in the loading position, in which the components to be tested are transferred from the conveying unit 3 (pick-and-place module) to the individual holding devices 12. The holding devices 12 have plungers 42 for this purpose. In position I, the components are placed on the outer ends of the plungers 42, where they are held by vacuum suction. The components lie parallel to the base plate 15 here.

When all the holding devices 12 are loaded with a component, the circulating carriage 10 can be rotated onwards through, for example, 15° clockwise into a position II (alignment station), in order to align the components, if necessary.

Once this procedure is finished, the circulating carriage 10 can be rotated onwards through, for example, another 15° into a position III (wait station), which corresponds to a wait position. In this position III, the circulating carriage 10 waits until another circulating carriage 10 has left a position IV, which corresponds to a 3 o'clock position.

Position IV (test station) is a position in which the drive arm 13 assumes a horizontal position and the circulating carriage 10 assumes a vertical position. In position IV, the components are brought to the test head 5 in a horizontal direction, in order for the components to make contact with the test head 5, and on completion of the test are taken away from the test head 5 again in a horizontal direction. The components are here brought to/taken away from the test head 5 by the plungers 42, in which the plungers 42 are extended/retracted relative to the rest of the holding device 12. In FIG. 2, the plunger 42 that is located on the circulating carriage 10 on the side is shown in the extended position, while the two plungers 42 of the upper circulating carriage 10 are shown in the retracted position. To extend the plungers 42, a device (not shown in the figures) for pushing the plungers forward is provided in the area between the drive shafts 22 and the circulating carriage 10 located in the side position, and acts on the rear end of the plungers 42. The base plate 15 contains suitable apertures for this in the region of the plungers 42. If the plungers 42 are pushed forward, the components held at the front end of the plungers 42 can be brought into contact with corresponding contacts of the test head 5, so that the electrical measurements can be made. On completion of the test, the plungers 42 are retracted into their retracted initial position by spring action.

On completion of the test, the circulating carriage 10 is rotated onwards from position IV into position V, in which the tested components are removed from the handler 4 by the unloader 6 (FIG. 1). The position V lies in the 6 o'clock position in the exemplary embodiment shown.

Once a circulating carriage 10 has left position IV, a subsequent circulating carriage 10, which is already waiting immediately adjacent to position IV, can be conveyed into position IV in the minimum of time.

After unloading the components, a circulating carriage 10 can be conveyed onwards into position VI, which is immediately adjacent to position I and corresponds approximately to an 11 o'clock position, for example. Position VI is again a wait position. In this wait position, the circulating carriage 10 waits until another circulating carriage, which is currently in position I and being loaded, has finished the loading procedure and has left position I. As soon as position I has become free, the circulating carriage 10 can be rotated onwards from position VI over the shortest possible distance and taking the minimum time into position I, in order to be loaded there with the new components.

It is evident that when a plurality of circulating carriages 10, which can move independently of each other, are used, then time-optimized, parallel working can be performed for loading (position I), testing (position IV) and unloading the components (position V), because for procedures that can be completed faster than other procedures, the remaining time can be used to convey the circulating carriage 10 concerned into a wait position immediately in front of the next position. Hence the components are immediately available for the next position when the previous circulating carriage 10 has left this position. The individual circulating carriages 10 can be rotated onwards here in steps, always in the same direction of rotation, into the next position in each case. It is not necessary to reverse the direction of rotation.

Extremely precise positioning of the circulating carriages 10 in the individual positions I-VI can be achieved by providing measurement strips on the circulating carriages 10 and measurement heads on the guidance device 9, which can use the measurement strips to determine the precise position of the circulating carriages, so that the drive motors 18a, 18b, 18c are made to continue moving the circulating carriages 10 until they assume the exact position required.

The invention claimed is:

1. Handler for electronic components, comprising:
   a plurality of circulating carriages that can move along a circulation path, each carriage having at least one holding device for holding a component,
   a drive device structured to move the circulating carriages, and
   a stationary, annular guidance device structured to guide the circulating carriages along the circulation path, said guidance device comprising at least one guide rail formed as a continuous loop,
   wherein the drive device has a plurality of drive motors for moving the circulating carriages with each circulating carriage being operatively connected to its own associated drive motor.

2. Handler according to claim 1, wherein the circulating carriages can be moved independently of each other along the circulation path such that the mutual separation of the circulating carriages is variable.

3. Handler according to claim 1, wherein the guidance device comprises two annular guide rails, which are spaced laterally apart in two mutually parallel vertical planes.

4. Handler according to claim 3, wherein the circulating carriages are mounted on the two annular guide rails in the edge areas of their opposite sides.

5. Handler according to claim 4, wherein the two annular guide rails are composed of guide ridges arranged in a circular ring, and the circulating carriages have guide jaws that engage over the guide ridges.

6. Handler according to claim 3, wherein the two annular guide rails are composed of guide ridges arranged in a circular ring, and the circulating carriages have guide jaws that engage over the guide ridges.

7. Handler according to claim 1, wherein the handler has two to six circulating carriages.

8. Handler according to claim 1, wherein each circulating carriage is operatively connected to an associated assigned drive motor by means of a separate drive shaft and a drive arm that extends from the drive shaft out to the assigned circulating carriage.

9. Handler according to claim 8, wherein the drive shafts of the individual circulating carriages are arranged inside each other and are able to rotate about a common center axis.

10. Handler according to claim 9, wherein at least one of the drive shafts acts as a bearing mount for at least one other drive shaft.

11. Handler according to claim 9, wherein an electrical power transmission device is provided for transmitting electrical power between a fixed power generating source and the circulating carriages, where the power transmission device comprises slip rings, which are arranged in a fixed manner side by side along the centre axis, and brushes, which interact with the slip rings and are fixed to the drive arms.

12. Handler according to claim 11, wherein a plurality of brushes are spaced around the circumference of the slip rings.

13. Handler according to claim 9, wherein a data transmission device is provided for transmitting data between a stationary data processing installation and the circulating carriages, where the data transmission device comprises a plurality of slip-ring groups composed of slip rings, which are arranged in a fixed manner side by side along the centre axis, and collector contacts, which interact with the slip rings and are fixed to the drive arms.

14. Handler according to claim 13, wherein the slip rings of the electrical power transmission device and of the data transmission device are arranged in close proximity to each other.

15. Handler according to claim 8, wherein one of the drive shafts is connected to a vacuum/fluid transmission device aligned with it, which can be used to transmit the vacuum and/or fluid from a stationary vacuum/fluid supply source to the circulating carriages.

16. Handler according to claim 15, wherein the vacuum/fluid transmission device has a housing connected to the drive shaft so that they co-rotate, and a central piece arranged inside the housing, which can be fixed so that it is stationary in the handler, and which, via axial holes and radial holes assigned to these axial holes, creates a vacuum/fluid connection to radial through-channels of the housing, which is able to rotate with the drive shaft.

17. Handler according to claim 1, wherein the circulating carriages can be moved by linear motors, which are operatively connected to the annular guidance device.

18. Handler for electronic components, comprising:
a plurality of circulating carriages that can move along a circulation path, each carriage having at least one holding device for holding a component,
a drive device structured to move the circulating carriages, and
a stationary, annular guidance device structured to guide the circulating carriages along the circulation path, said guidance device comprising at least one guide rail formed as a continuous loop,
wherein the circulating carriages each have a base plate, and the at least one holding device comprises a plunger that can move perpendicular to the base plate of an assigned circulating carriage, and at whose front end at least one component is held by a vacuum.

19. Handler for electronic components, comprising:
a plurality of circulating carriages that can move along a circulation path, each carriage having at least one holding device for holding a component,
guidance means for guiding the circulating carriages along the circulation path, a drive device for moving the circulating carriages,
wherein the circulating carriages are guided along their circulation path by means of a stationary, annular guidance device, which comprises at least one guide rail formed as a continuous loop,
wherein the drive device has a plurality of drive motors for moving the circulating carriages with each circulating carriage being operatively connected to its own associated drive motor.

* * * * *